US008941813B2

(12) United States Patent
Arai (10) Patent No.: US 8,941,813 B2
(45) Date of Patent: Jan. 27, 2015

(54) EVALUATION METHOD, ADJUSTMENT METHOD, EXPOSURE APPARATUS, AND MEMORY MEDIUM

(75) Inventor: Tadashi Arai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1057 days.

(21) Appl. No.: 12/368,892

(22) Filed: Feb. 10, 2009

(65) Prior Publication Data

US 2009/0201480 A1     Aug. 13, 2009

(30) Foreign Application Priority Data

Feb. 12, 2008  (JP) ................................ 2008-031025

(51) Int. Cl.
*G03B 27/54* (2006.01)
*G02B 27/28* (2006.01)
*G03F 7/20* (2006.01)

(52) U.S. Cl.
CPC .............. *G03B 27/54* (2013.01); *G02B 27/28* (2013.01); *G03F 7/70258* (2013.01); *G03F 7/70566* (2013.01); *G03F 7/706* (2013.01)
USPC ............................................. 355/67; 355/71

(58) Field of Classification Search
CPC .... G02B 27/28; G03B 27/54; G03F 7/70258; G03F 7/705; G03F 7/70566; G03F 7/706
USPC ........... 355/30, 52, 53, 55, 67, 71; 359/341.1, 359/352; 700/59
See application file for complete search history.

(56) References Cited

U.S. PATENT DOCUMENTS

| | | | |
|---|---|---|---|
| 7,386,830 B2 | 6/2008 | Fukuhara | |
| 2004/0010385 A1* | 1/2004 | Fukuhara et al. | 702/83 |
| 2005/0210438 A1* | 9/2005 | Verstappen et al. | 716/21 |
| 2006/0046168 A1* | 3/2006 | Fukuhara | 430/30 |
| 2006/0152700 A1 | 7/2006 | Yamada | |
| 2006/0170932 A1* | 8/2006 | Hayashi et al. | 356/495 |
| 2007/0046921 A1 | 3/2007 | Takahashi et al. | |

FOREIGN PATENT DOCUMENTS

| | | |
|---|---|---|
| JP | 2006-066440 A | 3/2006 |
| JP | 2006-173305 A | 6/2006 |
| JP | 2006-237109 A | 9/2006 |
| JP | 2007-035671 A | 2/2007 |

\* cited by examiner

*Primary Examiner* — Toan Ton
*Assistant Examiner* — Mona M Sanei
(74) *Attorney, Agent, or Firm* — Canon USA, Inc. IP Division (57) ABSTRACT

A method evaluating an imaging performance of a projection optical system according to a polarization state of light in a pupil of an illumination optical system for an exposure apparatus, comprises a representation step of numerically representing the polarization state in the pupil of the illumination optical system, an assumption step of virtually dividing the pupil of the illumination optical system into a plurality of partial regions, each of which includes a light incident region and a light non-incident region, and assuming individual polarization states for the plurality of partial regions so that one polarization state is assumed for the whole of each partial region based on the polarization state numerically represented in the representation step; and a calculation step of calculating the imaging performance of the projection optical system under a condition in which the plurality of partial regions have the polarization states individually assumed in the assumption step.

7 Claims, 7 Drawing Sheets

FIG. 2

FIG. 3A — EFFECTIVE LIGHT SOURCE DISTRIBUTION AND POLARIZATION STATE

FIG. 3B — PATTERN EXAMPLE

FIG. 3C — SCHEMATIC VIEW OF DIFFRACTED LIGHT INTENSITY DISTRIBUTION

$\sin\theta = \lambda/d$

EVALUATION METHOD, ADJUSTMENT METHOD, EXPOSURE APPARATUS, AND MEMORY MEDIUM

BACKGROUND OF THE INVENTION

1. Field of the Invention

The present invention relates to a method of evaluating the imaging performance of a projection optical system, a method of adjusting the imaging performance, an exposure apparatus having a function which implements each of the methods, and a memory medium for controlling each of the methods.

2. Description of the Related Art

An exposure apparatus which projects the pattern of an original onto a substrate, thereby exposing the substrate is used in lithography for manufacturing a device such as a semiconductor device. In recent years, along with further miniaturization of device patterns, a demand for improving the resolution of the exposure apparatus is increasing.

To improve the resolution of the exposure apparatus, the NA of the projection optical system is increasing. These days, an exposure apparatus having an NA of 0.90 or more, and an immersion lithography technique of attaining an effective NA of 1.0 or more by filling the space between the substrate and the final surface of the projection optical system with a medium having a refractive index of 1.0 or more have been put to practical use.

Along with an increase in the NA, the polarization state of incident light on the projection optical system exerts a significant influence on the resolution. Under the circumstance, a technique of controlling the polarization state (the polarization state includes non-polarization in a broad sense) of the incident light has been proposed in order to attain a higher resolution.

However, in practice, optical elements (including optical elements of the projection optical system and illumination optical system, an antireflection film, a reflection film, a reticle, a pellicle, and a resist) which change the polarization state are located in the optical path. For this reason, an image may not be formed on the substrate with a targeted polarization state.

Examples of the factors that make the optical elements change the polarization state are the intrinsic birefringences of crystal glass materials, residual stresses imparted to an optical system material, reticle, and substrate upon manufacturing them, stress birefringences generated upon holding them, and polarization differences in the reflection/transmission characteristics of the pellicle, resist, antireflection film, and reflection film.

Japanese Patent Laid-Open No. 2006-237109 discloses a method of evaluating the relationship between the distribution of the polarization state in the pupil of an optical system including an imaging optical system and the imaging performance of the imaging optical system. Japanese Patent Laid-Open No. 2006-173305 discloses a method of adjusting the aberration of the projection optical system in response to a change in the polarization state in the illumination system.

In considering diffraction of the light by the original (reticle), it is difficult to precisely calculate the imaging performance of the projection optical system unless it is assumed that the light enters the projection optical system even from a region other than an effective light source region (a region having a light intensity higher than a predetermined value in the pupil of the illumination optical system).

However, Japanese Patent Laid-Open Nos. 2006-237109 and 2006-173305 neither disclose nor suggest a method of evaluating the imaging performance of the projection optical system on the above-mentioned assumption.

SUMMARY OF THE INVENTION

It is an exemplary object of the present invention to provide a technique of more precisely evaluating the imaging performance of a projection optical system.

According to the first aspect of the present invention, there is provided a method of evaluating an imaging performance of a projection optical system according to a polarization state of light in a pupil of an illumination optical system for an exposure apparatus which illuminates an original by the illumination optical system and projects a pattern of the original onto a substrate by the projection optical system, the method comprising a representation step of numerically representing the polarization state in the pupil of the illumination optical system, an assumption step of virtually dividing the pupil of the illumination optical system into a plurality of partial regions, each of which includes a light incident region and a light non-incident region, and assuming individual polarization states for the plurality of partial regions so that one polarization state is assumed for the whole of each partial region based on the polarization state numerically represented in the representation step, and a calculation step of calculating the imaging performance of the projection optical system under a condition in which the plurality of partial regions have the polarization states individually assumed in the assumption step.

According to the second aspect of the present invention, there is provided a method of adjusting an imaging performance of a projection optical system in accordance with a polarization state of light in a pupil of an illumination optical system for an exposure apparatus which illuminates an original by the illumination optical system and projects a pattern of the original onto a substrate by the projection optical system, the method comprising a representation step of numerically representing the polarization state in the pupil of the illumination optical system, an assumption step of virtually dividing the pupil of the illumination optical system into a plurality of partial regions, each of which includes a light incident region and a light non-incident region, and assuming individual polarization states for the plurality of partial regions so that one polarization state is assumed for the whole of each partial region based on the polarization state numerically represented in the representation step, a calculation step of calculating the imaging performance of the projection optical system under a condition in which the plurality of partial regions have the polarization states individually assumed in the assumption step, and an adjustment step of adjusting the imaging performance of the projection optical system based on the imaging performance calculated in the calculation step.

According to the third aspect of the present invention, there is provided an exposure apparatus comprising an illumination optical system configured to illuminate an original, a projection optical system configured to project a pattern of the original illuminated by the illumination optical system onto a substrate, and a control unit configured to adjust an imaging performance of the projection optical system, wherein the control unit executes a process including a representation step of numerically representing the polarization state in the pupil of the illumination optical system, an assumption step of virtually dividing the pupil of the illumination optical system into a plurality of partial regions, each of which includes a light incident region and a light non-incident region, and assuming individual polarization states for the plurality of partial regions so that one polarization state is assumed for the whole of each partial region based on the polarization state numerically represented in the representation step, a calculation step of calculating the imaging performance of the projection optical system under a condition in which the plurality of partial regions have the polarization states individually assumed in the assumption step, and an adjustment step of adjusting the imaging performance of the projection optical system based on the imaging performance calculated in the calculation step.

According to the fourth aspect of the present invention, there is provided a memory medium storing a computer program for making a computer execute a process for evaluating an imaging performance of a projection optical system according to a polarization state of light in a pupil of an illumination optical system for an exposure apparatus which illuminates an original by the illumination optical system and projects a pattern of the original onto a substrate by the projection optical system, the process comprising a representation step of numerically representing the polarization state in the pupil of the illumination optical system, an assumption step of virtually dividing the pupil of the illumination optical system into a plurality of partial regions, each of which includes a light incident region and a light non-incident region, and assuming individual polarization states for the plurality of partial regions so that one polarization state is assumed for the whole of each partial region based on the polarization state numerically represented in the representation step, and a calculation step of calculating the imaging performance of the projection optical system under a condition in which the plurality of partial regions have the polarization states individually assumed in the assumption step.

According to the fifth aspect of the present invention, there is provided a memory medium storing a computer program for making a computer execute a process for adjusting an imaging performance of a projection optical system in accordance with a polarization state of light in a pupil of an illumination optical system for an exposure apparatus which illuminates an original by the illumination optical system and projects a pattern of the original onto a substrate by the projection optical system, the process comprising a representation step of numerically representing the polarization state in the pupil of the illumination optical system, an assumption step of virtually dividing the pupil of the illumination optical system into a plurality of partial regions, each of which includes a light incident region and a light non-incident region, and assuming individual polarization states for the plurality of partial regions so that one polarization state is assumed for the whole of each partial region based on the polarization state numerically represented in the representation step, a calculation step of calculating the imaging performance of the projection optical system under a condition in which the plurality of partial regions have the polarization states individually assumed in the assumption step, and an adjustment step of adjusting the imaging performance of the projection optical system based on the imaging performance calculated in the calculation step.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

Figure 1:
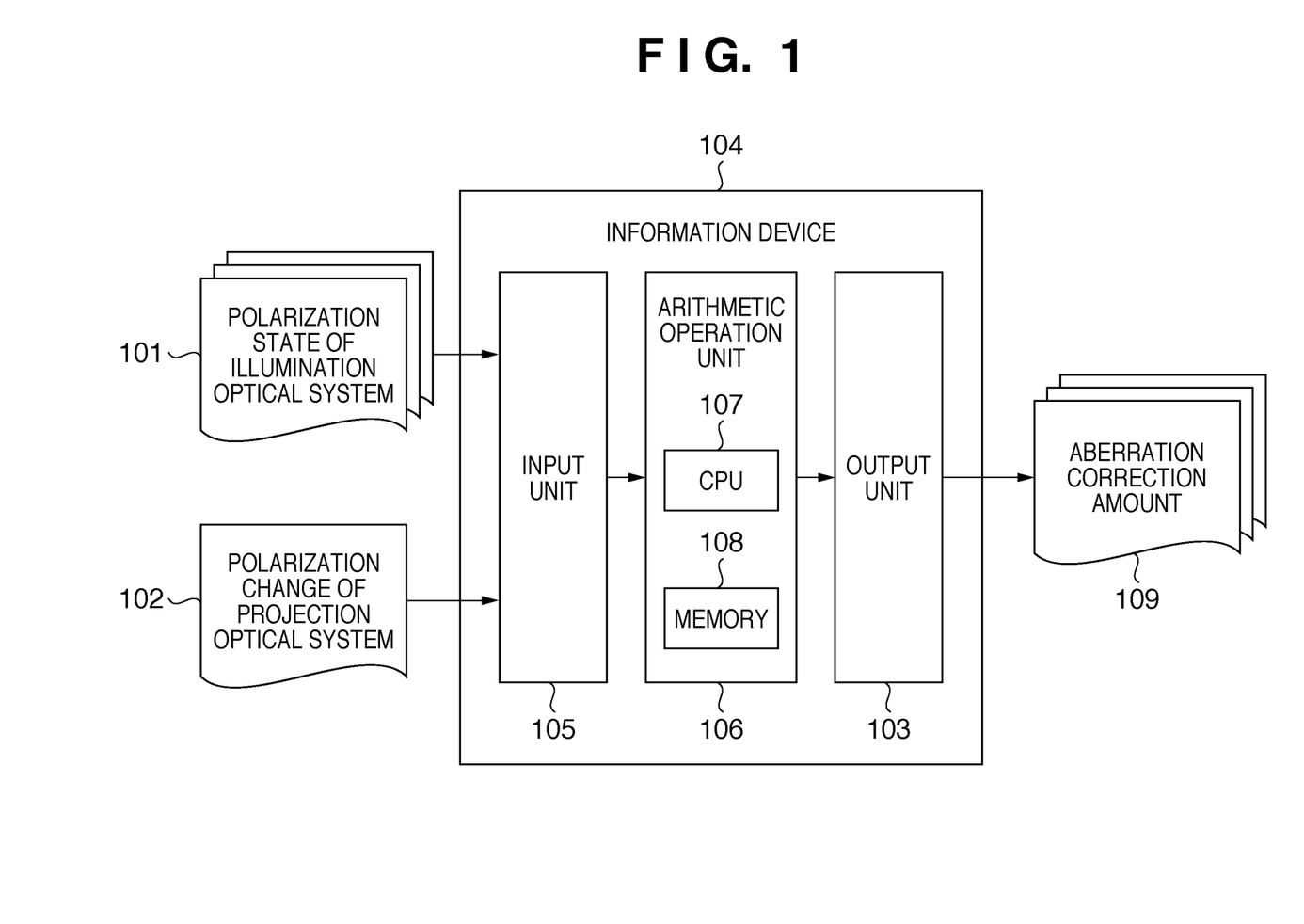
FIG. 1 is a block diagram schematically showing the configuration of an information device in an exposure apparatus according to a preferred embodiment of the present invention.
Figure 7:
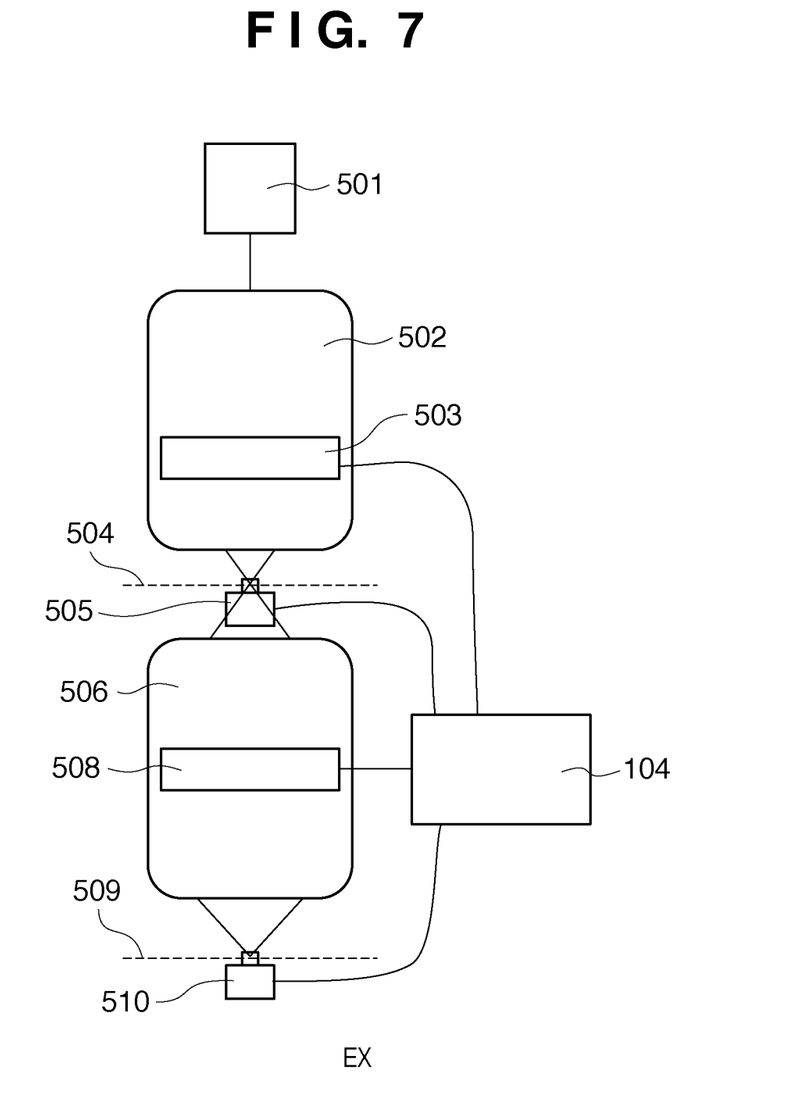
FIG. 7 is a view schematically showing the arrangement of an exposure apparatus according to a preferred embodiment of the present invention.

FIG. 7 is a view schematically showing the arrangement of an exposure apparatus according to a preferred embodiment of the present invention. FIG. 1 is a block diagram schematically showing the configuration of an information device in the exposure apparatus shown in FIG. 7. An exposure apparatus EX can include a light source 501, an illumination optical system 502, a projection optical system 506, an original stage (not shown) for locating an original (reticle) onto an object plane 504 of the projection optical system 506, and a substrate stage (not shown) for locating a substrate onto an image plane 509 of the projection optical system 506.

The light source 501 can be, for example, an excimer laser such as an ArF, KrF, or $F_2$ excimer laser, an EUV light source, or a lamp such as an i-line lamp or g-line lamp. Using light emitted by the light source 501, the illumination optical system 502 generates a targeted effective light source (a light intensity distribution on the pupil plane), and a polarizer 503 controls its polarization state. The original located on the object plane 504 of the projection optical system 506 is illuminated with the light which emerges from the illumination optical system 502.

The pattern of the original located on the object plane 504 of the projection optical system 506 is projected onto the substrate located on the image plane 509 of the projection optical system 506 by the projection optical system 506. With this operation, the photosensitive agent applied on the substrate is exposed.

The exposure apparatus EX can include a measurement device 505 for measuring the polarization state of the light in the pupil of the illumination optical system 502. The measurement device 505 sends information 101 representing the measured polarization state of the light in the pupil of the illumination optical system 502 to an information device (which can also be interpreted as a controller or a computer) 104. The measurement device 505 can be set so as to measure the polarization state of the illumination light on the object plane 504 of the projection optical system 506 or its conjugate plane.

The exposure apparatus EX can also include a measurement device 510 for measuring the polarization state of the light which enters the image plane 509 to which the substrate is located. The polarization state of the light which enters the image plane 509 can be assumed to be the same as that of the light which emerges from the projection optical system 506. The measurement device 510 sends, as the measurement result, information 102 representing the polarization change of the projection optical system 506 to the information device 104.

As described above, the exposure apparatus EX preferably includes the measurement devices 505 and 510. However, pieces of information 101 and 102 may be acquired in the following way. For example, it is possible to measure the polarization state of light emitted by the light source 501, and the polarization changes of optical elements which constitute the illumination optical system 502 and projection optical system 506 in assembling the exposure apparatus EX, thereby acquiring pieces of information 101 and 102 based on these measurement results.

The information device 104 evaluates the aberration of the projection optical system 506 as the imaging performance of the projection optical system 506, which can change in response to a change in the polarization state of the light in the pupil of the illumination optical system 502. The information device 104 provides an aberration correction amount 109 for correcting the evaluated aberration to a correction mechanism 508. The correction mechanism 508 corrects the aberration as the imaging performance of the projection optical system 506 based on the aberration correction amount 109.

The polarization state of the light in the pupil of the illumination optical system 502 can change depending on the exposure conditions (the illumination conditions and original used). The imaging performance of the projection optical system 506 can change depending on the polarization state of the light in the pupil of the illumination optical system 502. It is therefore possible to suppress deterioration in the imaging performance of the projection optical system 506 attributed to the polarization state by adjusting a parameter which influences the imaging performance of the projection optical system 506 in accordance with the polarization state.

The information device 104 can include, for example, an input unit 105, arithmetic operation unit 106, and output unit 103. The arithmetic operation unit 106 can include a CPU 107 and memory 108. The function of the arithmetic operation unit 106 can be defined by a computer program which is, for example, stored in or loaded into the memory 108 and executed by the CPU 107.

The arithmetic operation unit 106 represents the polarization state of the light in the pupil of the illumination optical system 502 by numeric values (the Stokes parameters in this case) based on the information 101 representing the polarization state of the light in the pupil of the illumination optical system 502. Also, the arithmetic operation unit 106 represents the polarization change of the projection optical system 506 by numeric values (a Jones matrix in this case) based on the information 102 representing the polarization change of the projection optical system 506.

Figure 2:
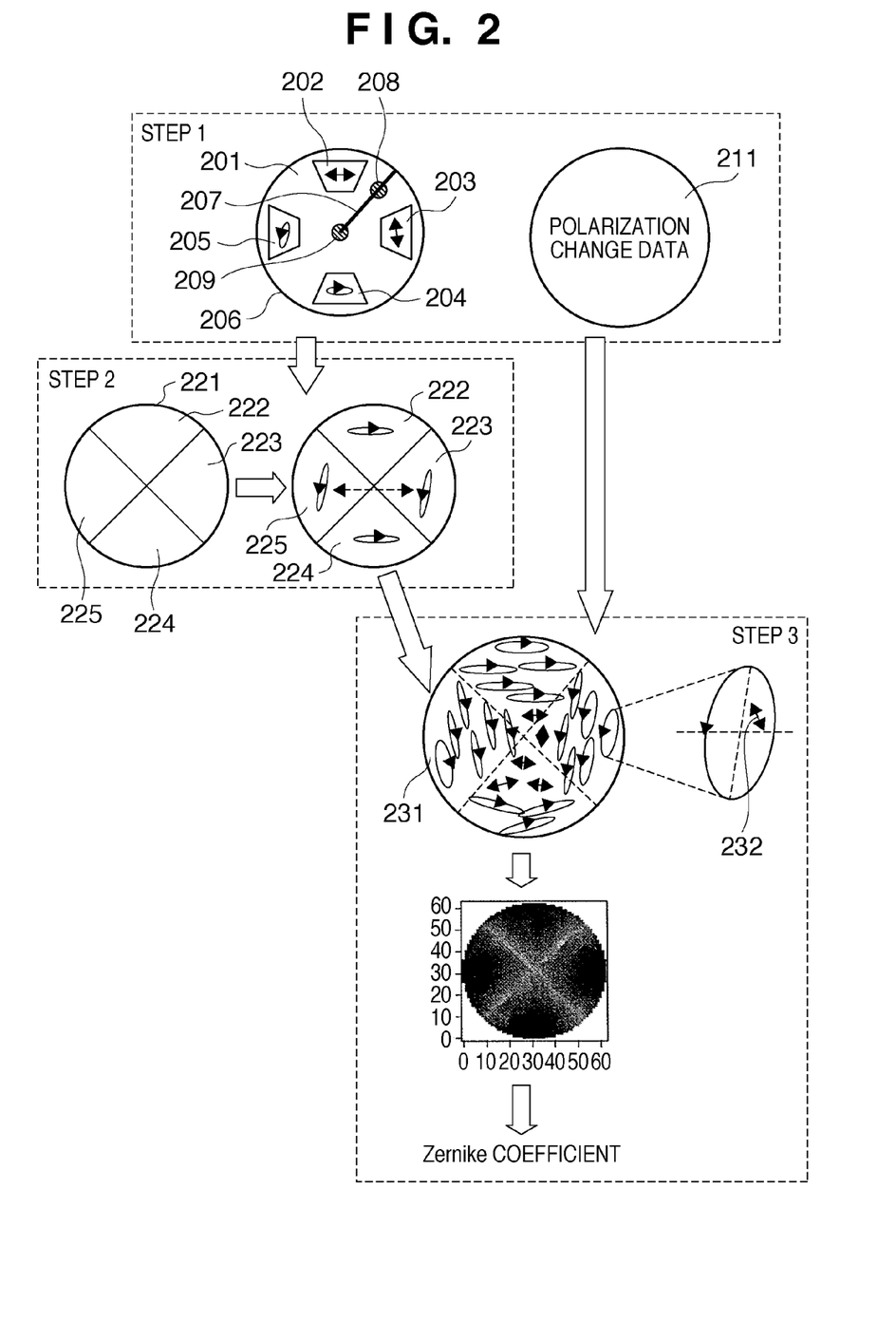
FIG. 2 is a view schematically showing the sequence of an evaluation method according to a preferred embodiment of the present invention.

FIG. 2 is a view schematically showing the sequence of a method of evaluating the imaging performance of the projection optical system 506 according to the polarization state of the light in the pupil of the illumination optical system 502. The process in this sequence can be controlled by the arithmetic operation unit 106 based on a computer program stored in or loaded into the memory 108.

In step 1 (representation step), the arithmetic operation unit 106 represents the polarization state in the pupil of the illumination optical system 502 by numeric values (the Stokes parameters in this case) based on the information 101. Also, the arithmetic operation unit 106 represents the polarization change of the projection optical system 506 by numeric values (a Jones matrix in this case) based on the information 102. The polarization change of the projection optical system 506 is a characteristic representing the relationship between the polarization state of the light which enters the projection optical system 506 and that of the light which emerges from the projection optical system 506.

A method of representing the polarization state in the pupil of the illumination optical system 502 by the Stokes parameters will be explained first.

The Stokes parameters include four components $S_0, S_1, S_2$, and $S_3$. The four components of the Stokes parameters are calculated by four intensities $I_0, I_1, I_2$, and $I_3$. The components $S_0, S_1, S_2$, and $S_3$ and the intensities $I_0, I_1, I_2$, and $I_3$ satisfy:

$$S_0 = 2I_0$$

$$S_1 = 2I_1 - 2I_0$$

$$S_2 = 2I_2 - 2I_0$$

$$S_3 = 2I_3 - 2I_0 \qquad (1)$$

For example, the intensities $I_0, I_1, I_2$, and $I_3$ can be detected in the following way.

First to fourth filters are prepared. Each of these filters has a function of transmitting a half of the incident light and filtering out its remaining half upon non-polarized illumination. The first to fourth filters are additionally imparted with the following functions.

The first filter: it equally transmits light components in all polarization states The second filter: it has a transmission axis in the horizontal direction The third filter: it has its transmission axis in the +45° direction The fourth filter: it forms right-handed circular polarization Only one of the first to fourth filters is inserted in the optical path of the illumination optical system 502 at one time. The measurement device 505 has no sensitivity to the polarization state, and measures the intensity of a light component having passed through the filter inserted in the optical path of the illumination optical system 502.

Let $I_0$ be the intensity of a light component measured by the measurement device 505 using the first filter. Likewise, let $I_1$, $I_2$, and $I_3$ be the intensities of light components measured by the measurement device 505 using the second filter, third filter, and fourth filter, respectively. The intensities $I_0, I_1, I_2$, and $I_3$ obtained in this way can be provided to the information device 104 as the information 101. The information device 104 can obtain Stokes parameters by substituting the intensities $I_0, I_1, I_2$, and $I_3$ into equations (1).

Although the polarization state in the pupil of the illumination optical system is described by the Stokes parameters herein, there are various numerical representations which describe the polarization state, such as a Jones vector, intensity, relative intensity difference, phase, relative phase difference, and degree of partial polarization, in addition to the Stokes parameters. The same effect can be obtained even by using other representations as long as they can serve to predict the polarization state of the exit light based on the polarization state in the pupil of the illumination optical system, and the polarization change of the projection optical system.

Representation using a Jones matrix will be explained as a method of numerical representation of the polarization change of the projection optical system 506.

A Jones matrix JM is given by a complex 2×2 matrix:

$$JM = A_{sc}\exp(i\varphi_{sc})JM_{po} \quad (2)$$

$$= A_{sc}\exp(i\varphi_{sc})\begin{pmatrix} JM_{po11} & JM_{po12} \\ JM_{po12} & JM_{po22} \end{pmatrix}$$

where $A_{sc}$ is the common component of the transmittance of the projection optical system 506, and $\phi_{sc}$ is the common component of the phase of the light having propagated through the projection optical system 506.

For example, the Jones matrix JM is obtained in the following way.

Letting E be the vector of an electromagnetic field running in the z direction, $E_x$ be its component in the x direction, and $E_y$ be its component in the y direction, the polarization parameter is given by $\chi=E_y/E_x$. Light components having three polarization parameters (for example, linearly polarized light components having deflection angles of 0°, +45°, and −45°) $\chi_{in1}$, $\chi_{in2}$, and $\chi_{in3}$ are input to the projection optical system 506, and polarization parameters $\chi_{out1}$, $\chi_{out2}$, and $\chi_{out3}$ of the output light components are detected. Assume that H is defined by:

$$H = \frac{(\chi_{out3} - \chi_{out1})(\chi_{in3} - \chi_{in1})}{(\chi_{out3} - \chi_{out2})(\chi_{in3} - \chi_{in2})}. \quad (3)$$

Then, the respective components of the Jones matrix JM are given by:

$$JM_{pe11} = \chi_{in2} - \chi_{in1}H$$

$$JM_{pe22} = H - 1$$

$$JM_{pe21} = \chi_{in2}\chi_{out1} - \chi_{in1}\chi_{out2}H$$

$$JM_{pe22} = -\chi_{out1} + \chi_{out2}H \quad (4)$$

Although the polarization change of the projection optical system is described by a Jones matrix herein, there are various other numerical representations which describe the polarization change, such as a Mueller matrix, Pauli spin matrix, retardance diattenuation, and deflection angle. The same effect can be obtained even by using other representations because the polarization state of the exit light can be predicted based on the polarization state in the illumination optical system, and the polarization change of the projection optical system.

How to obtain the polarization state and polarization change of one light beam has been described above. In an exposure apparatus, light which forms an image at one point on the image plane or its conjugate plane includes light beams which enter it at a plurality of incident angles, and has a characteristic which can be represented by the pupil exhibiting the incident angle characteristics of the light beams. Assuming that the incident angle of one element (a point or a region having a very small area) of the pupil is represented by a two-dimensional coordinate position $(\xi, \eta)$, a Stokes parameter S and Jones matrix JM can be represented by $S[\xi][\eta]$ and $JM[\xi][\eta]$, respectively. The use of this representation allows collective analysis of various errors generated by optical elements.

The distribution in the pupil exhibiting the incident angle characteristics of the light sources which illuminate the original is called the effective light source.

In step 2 (assumption step), the arithmetic operation unit 106 virtually divides the pupil of the illumination optical system 502 into a plurality of partial regions, and assumes individual polarization states for the plurality of partial regions. Note that the arithmetic operation unit 106 assumes one polarization state for the whole of each partial region based on the polarization state in the illumination optical system 502 numerically represented in step 1.

In step 1, the polarization state in a pole in the pupil of the illumination optical system 502 (a region having a light intensity higher than a predetermined value in the pupil of the illumination optical system 502) can be determined as that in the pupil of the illumination optical system 502. However, considering diffraction by the original, a light beam enters a region other than a pole in the pupil of the projection optical system 506 (a region corresponding to the pole in the pupil of the illumination optical system 502). Therefore, unless the polarization state in a region other than the pole in the pupil of the illumination optical system 502 is defined, it is impossible to appropriately evaluate the influence that the polarization state exerts on the aberration of the projection optical system 506.

In view of this, the polarization state in a region other than the pole in the pupil of the illumination optical system 502 is assumed in this embodiment.

A method of virtually dividing the pupil of the illumination optical system 502 into a plurality of partial regions will be explained first. Quadrupole illumination will be taken as an example herein. In quadrupole illumination, a pupil 201 of the illumination optical system 502 has four poles 202, 203, 204, and 205. A line which virtually divides the pupil of the illumination optical system 502 into a plurality of partial regions can be determined as, for example, a line segment 207 which passes through a point 208 between the poles 202 and 203 that are adjacent in the circumferential direction of a circle having a center 209 of the pupil 201 as its center, and reaches a contour 206 of the pupil 201 from the center 209 of the pupil 201. By assuming line segments which divide all the poles 202, 203, 204, and 205 from each other in this way, a plurality of sector regions are determined as a plurality of partial regions 222, 223, 224, and 225, as in a divided pattern 221.

A method of assuming individual polarization states for the plurality of partial regions 222, 223, 224, and 225 will be explained next. For example, assume that the pole 202 includes a plurality of elements, for each of which the above-mentioned Stokes parameters are determined in step 1. In this case, the sums, in the pole 202, of the components $S_0$, $S_1$, $S_3$, and $S_4$ of the Stokes parameters for the elements which constitute the pole 202 are calculated for each component, and the polarization state in the partial region 222 is assumed based on the sums.

Figure 3A:
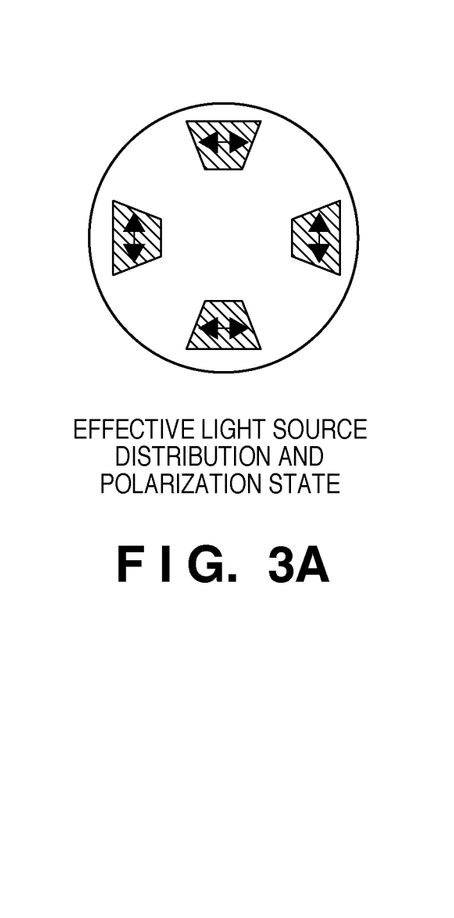
FIGS. 3A to 3C are views showing the relationship among the effective light source distribution, the original pattern, and the diffracted light.
Figure 3B:
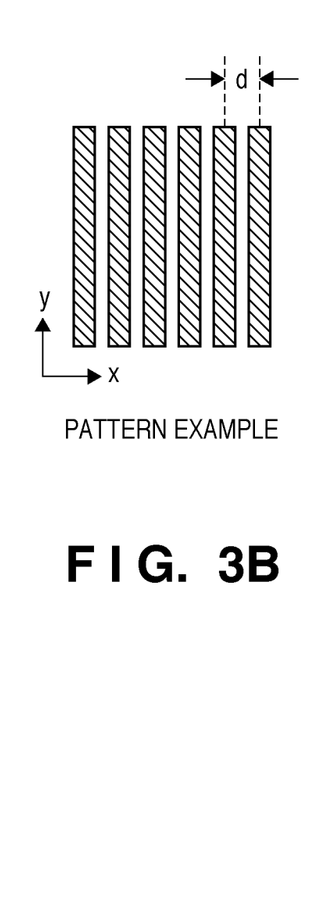
Figure 3C:
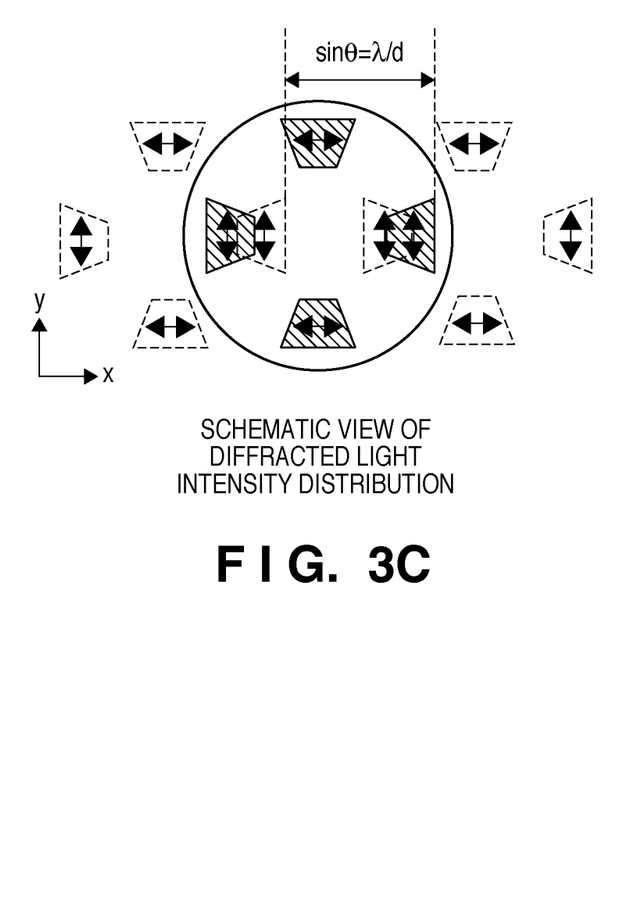

FIGS. 3A, 3B, and 3C show the relationship among the effective light source distribution, the original pattern, and the diffracted light. As exemplified in FIG. 3B, a repetitive pattern having a cycle d in the x direction will be considered as the original pattern. In this case, as shown in FIG. 3C, the diffracted light shifts by an angle $\sin\theta = \lambda/d$ in the x direction on the coordinate system in the pupil of the projection optical system 506. For this reason, evaluation which takes account of the diffracted light can be performed by assuming the polarization states of the facing sector regions (partial regions) 223 and 225 as a common polarization state, as exemplified in FIG. 2. In an example of the Stokes parameters, the polarization states of facing partial regions can be determined as a common polarization state by calculating the sums of the respective components of the Stokes parameters in the facing partial regions.

In step 3, the arithmetic operation unit 106 calculates the imaging performance of the projection optical system 506 under a condition in which the plurality of partial regions 222 to 225 have the polarization states individually assumed in step 2.

A method of calculating the amount of aberration using the polarization state for each partial region assumed in step 2, and the Jones matrix serving as the polarization change of the projection optical system 506 determined in step 1 will be explained as one example herein.

A case in which the Stokes parameters are used as the polarization state in the pupil of the illumination optical system 502 will be considered. In this case, if the Mueller matrix can be calculated as the polarization change of the projection optical system 506 with high accuracy, the polarization state of the exit light is preferably predicted using the Stokes parameters in the illumination optical system and the Mueller matrix in the projection optical system. However, in practice, it is difficult to obtain the Mueller matrix with high accuracy. To combat this situation, it is preferable to measure the Jones matrix, decompose the Stokes parameters into a Jones vector and a degree of partial polarization, and multiply the decomposition result by the Jones matrix, thereby approximately predicting the polarization state of the exit light and converting the predicted polarization state into an amount of aberration.

For example, the amount of aberration can be calculated by the following four steps a to d.

step a: The Stokes parameters whose sums in each partial region in the pupil of the illumination optical system 502 are obtained are transformed into a Jones vector and a degree of partial polarization. Note that, as the Jones vector and the degree of partial polarization of a light component which enters each element of the pupil of the projection optical system 506, the same values as used in each region are used in its corresponding region in the projection optical system 506.

step b: The Jones vector in the exit pupil of the projection optical system 506 is obtained using the Jones vector obtained in step a, and the Jones matrix in each element of the pupil of the projection optical system 506.

step c: The phase in a direction in which the amplitude of the Jones vector is maximum in the exit pupil of the projection optical system 506 is obtained.

step d: An approximate value of the aberration correction amount is obtained using the phase in the direction in which the amplitude is maximum and the degree of partial polarization.

Details of steps a to d will be explained below.
<Step a>

A method of representing the polarization state in the pupil of the illumination optical system by the Stokes parameters is convenient for determining a typical polarization state in each partial region. However, because the polarization change of the projection optical system 506 is represented by a Jones matrix, it is necessary to transform the Stokes parameters into a Jones vector.

The Stokes parameters can be transformed into a Jones vector in accordance with the following equations.

Using the Stokes parameters expressed by the equations (1), an intensity V of partially polarized light expressed is given by:

$$V = \sqrt{S_1^2 + S_2^2 + S_3^2}/S_0 \quad (5)$$

Assume that $A_x$, $A_y$, and $\delta$ are defined by:

$$A_x = \sqrt{(VS_0 + S_1)/2}$$

$$A_y = \sqrt{(VS_0 - S_1)/2}$$

$$\delta = \tan^{-1}(S_3/S_2) \quad (6)$$

Then, the numerical representation of partially polarized light is transformed into a Jones vector $J_{in}$:

$$J_{in} = \begin{pmatrix} J_{inx} \\ J_{iny} \end{pmatrix} = \begin{pmatrix} A_x \exp(i\delta/2) \\ A_y \exp(-i\delta/2) \end{pmatrix} \quad (7)$$

By the above-mentioned sequence, the Stokes parameters can be transformed into the Jones vector of the light which enters the projection optical system.
<Step b>

The Jones vector in the exit pupil of the projection optical system is obtained using the Jones vector $J_{in}$ obtained in step a, and the Jones matrix in the projection optical system.

Using the Jones vector expressed by equation (7) for the illumination optical system, and the Jones matrix expressed by equation (2) for the projection optical system, the polarization state of the light which emerges from the pupil of the projection optical system is given by:

$$J_{out} = JM_{po}J_{in} \quad (8)$$

The use of this equation makes it possible to obtain the Jones vector in the exit pupil of the projection optical system.
<Step c>

The phase and amplitude in a direction in which the amplitude of the Jones vector is maximum, and those in a direction perpendicular to it in the exit pupil of the projection optical system are obtained.

First, a direction $\theta_{main}$ in which the amplitude is maximum is given by:

$$J_{out} = \begin{pmatrix} J_{xout} \\ J_{yout} \end{pmatrix} = \begin{pmatrix} A_{xout} \exp(i\varphi_{xout}) \\ A_{yout} \exp(i\varphi_{yout}) \end{pmatrix} \quad (9)$$

$$\theta_{main} = \frac{1}{2}\tan^{-1}\left(\frac{2A_{xout}A_{yout}\cos(\delta_{out})}{A_{xout}^2 - A_{yout}^2}\right)$$

A Jones vector $J_{rot}$ upon coordinate transformation in a direction perpendicular to the direction $\theta_{main}$ is given by:

$$J_{rot} = \begin{pmatrix} J_{rot1r} + iJ_{rot1i} \\ J_{rot2r} + iJ_{rot2i} \end{pmatrix} \quad (10)$$

$$= \begin{pmatrix} \cos(\theta_{main}) & \sin(\theta_{main}) \\ -\sin(\theta_{main}) & \cos(\theta_{main}) \end{pmatrix} J_{out}$$

A phase $\phi_{main}$ in the direction $\theta_{main}$ in which the amplitude is maximum, and a phase $\phi_{orth}$ in a direction perpendicular to it are given by:

$$\phi_{main} = \tan^{-1}(J_{rot1i}/J_{rot1r})$$

$$\phi_{orth} = \tan^{-1}(J_{rot2i}/J_{rot2r}) \quad (11)$$

Also, an amplitude $A_{main}$ in the direction $\theta_{main}$ in which the amplitude is maximum, and an amplitude $A_{orth}$ in a direction perpendicular to it are given by:

$$A_{main} = \sqrt{J_{rot1r}^2 + J_{rot1i}^2}$$

$$A_{orth} = \sqrt{J_{rot2r}^2 + J_{rot2i}^2} \quad (12)$$

<Step d>

The targeted phase is obtained using the amplitude and phase in the direction in which the amplitude is maximum, and the degree of partial polarization.

An approximate value $\phi_{target}$ of the aberration correction amount is given by:

$$\varphi_{target} = \left( \frac{2A_{main}^2}{(A_{main}^2 + A_{orth}^2)} - 1 \right) V\varphi_{main} + \varphi_{sc} \quad (13)$$

where $\phi_{sc}$ is the common component of the phase obtained by equation (2), $A_{main}$ is the amplitude in the direction in which the amplitude is maximum, $A_{orth}$ is the amplitude in a direction perpendicular to the direction in which the amplitude is maximum, and V is the degree of partial polarization.

Note that each element of the pupil of the projection optical system has the value $\phi_{target}$. Using the coordinates $\xi$ and $\eta$ of each element, $\phi_{target}$ is rewritten as $\phi_{target}[\xi][\eta]$/which can be used as the wavefront aberration and therefore be easy to use. Also, $\phi_{target}[\xi][\eta]$ may be expanded by an orthogonal function such as a Zernike cylinder function to separately determine and save the Zernike coefficients of the phases of a non-polarized light component and polarized light component. In this case, it is possible to change a coefficient to add up, in accordance with changes in the exposure conditions such as change in the illumination conditions.

Although the present invention has been exemplified by taking quadrupole illumination as an example, the present invention is also applicable to other illumination conditions. FIGS. 4A to 4C, 5A to 5C, and 6A to 6C are views exemplifying illumination conditions to which the present invention is applicable.

Figure 4A:
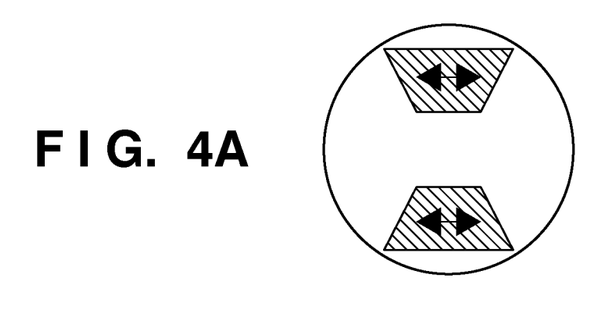
FIGS. 4A to 4C are views exemplifying an evaluation method and evaluation result according to an effective light source.
Figure 4B:
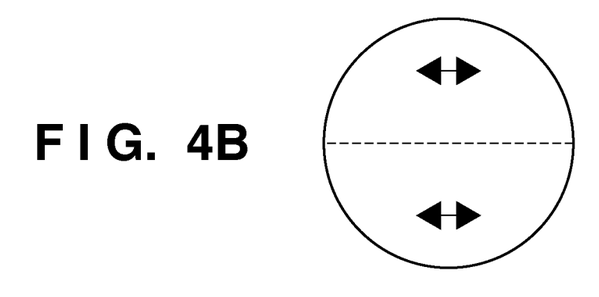
Figure 4C:
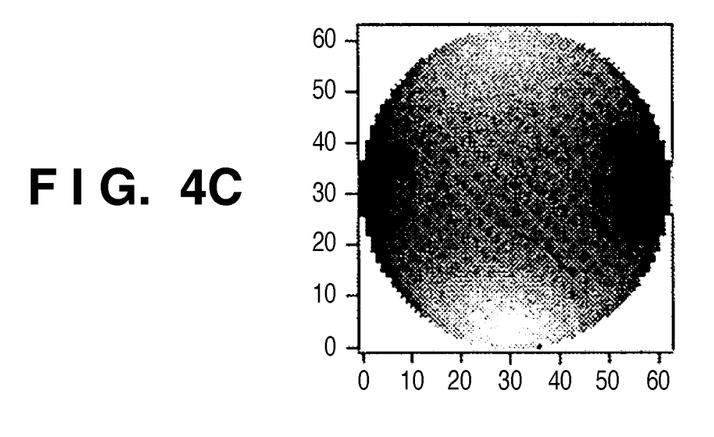
Figure 5A:
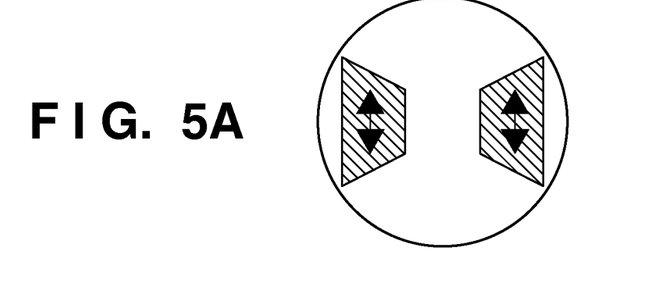
FIGS. 5A to 5C are views exemplifying an evaluation method and evaluation result according to another effective light source.
Figure 5B:
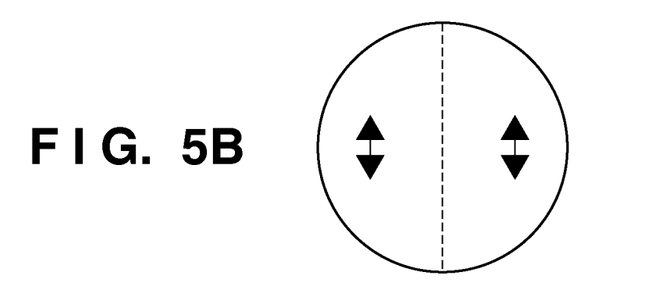
Figure 5C:
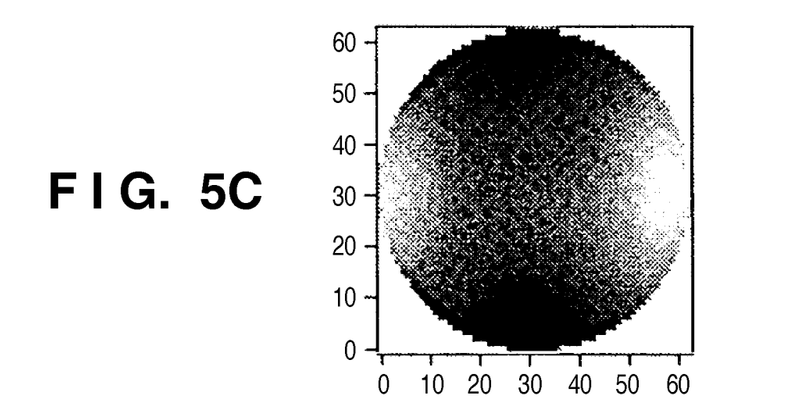
Figure 6A:
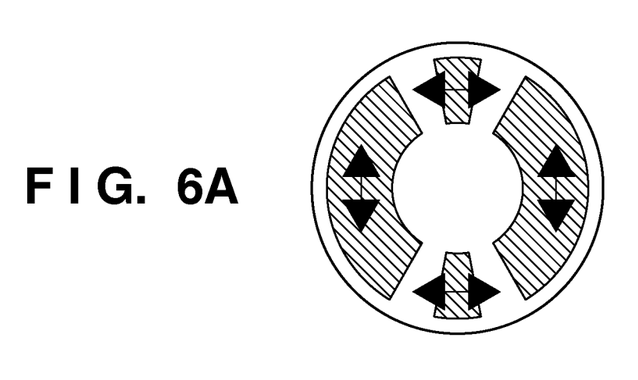
FIGS. 6A to 6C are views exemplifying an evaluation method and evaluation result according to still another effective light source.
Figure 6B:
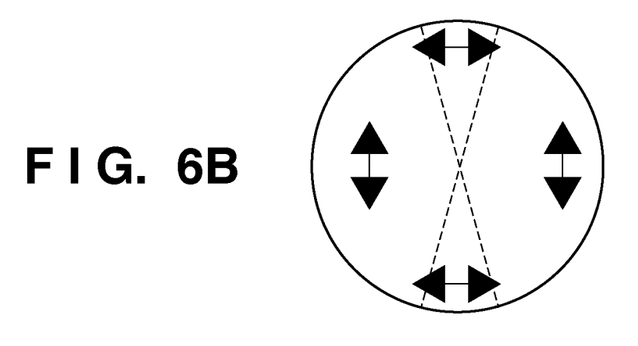
Figure 6C:
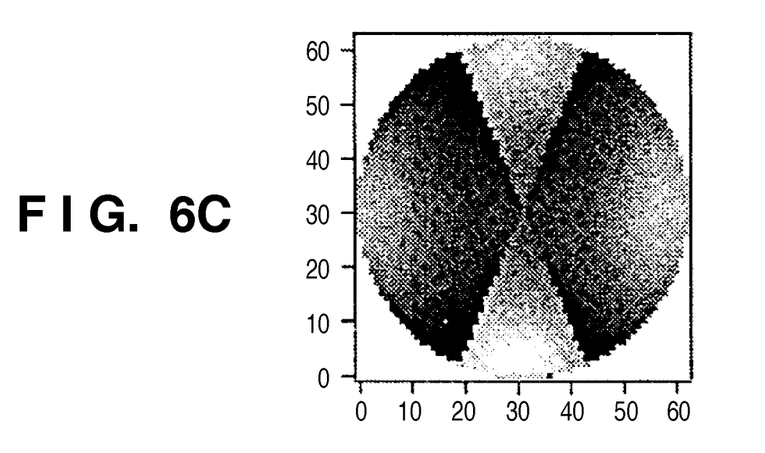

FIGS. 4A, 5A, and 6A show regions each having a light intensity higher than a predetermined value (effective light source) on the pupil plane of the illumination optical system 502, and the polarization directions in these regions. FIGS. 4B, 5B, and 6B show the polarization states assumed in step 2. FIGS. 4C, 5C, and 6C show the imaging performances (aberrations) of the projection optical system 506 obtained in step 3.

FIGS. 4A to 4C and 5A to 5C show examples of illumination having two poles. FIGS. 6A to 6C show special illumination.

As can be understood from FIGS. 4A to 4C, 5A to 5C, and 6A to 6C, the aberration of the projection optical system changes depending on changes in the exposure conditions such as the effective light source (light intensity distribution) and original used. Hence, changing the aberration correction amount of the projection optical system in response to changes in the exposure conditions makes it possible to adjust the imaging performance of the projection optical system in accordance with the exposure conditions.

As described above, the exposure apparatus EX includes the correction mechanism 508 for correcting the aberration of the projection optical system 506. The correction mechanism 508 corrects the aberration of the projection optical system 506 based on the aberration correction amount calculated by the information device 104.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-031025, filed Feb. 12, 2008, which is hereby incorporated by reference herein in its entirety.

What is claimed is:

1. A method of evaluating an aberration of a projection optical system for an exposure apparatus which illuminates an original by an illumination optical system and projects a pattern of the original onto a substrate by the projection optical system, the method comprising:

setting an effective light source distribution and a polarization state in a pupil of the illumination optical system, the effective light source distribution including a plurality of poles each having a light intensity higher than a predetermined value;

dividing the pupil of the illumination optical system into a plurality of first partial regions in accordance with an arrangement of the plurality of poles in the effective light source distribution, and dividing a pupil of the projection optical system into a plurality of second partial regions respectively corresponding to the plurality of first partial regions of the pupil of the illumination optical system;

assuming polarization states for the plurality of second partial regions of the pupil of the projection optical system so that one polarization state that is determined based on a polarization state in the pole of a first partial region of the plurality of first partial regions is assumed for a whole of a corresponding second partial region of the plurality of second partial regions; and determining a polarization state of light which emerges from the projection optical system, under a condition in which the plurality of second partial regions have the assumed polarization states, based on characteristics of a polarization change of the projection optical system that represents a relationship between a polarization state of light which enters the projection optical system and light that emerges from the projection optical system, and calculating the aberration of the projection optical system based on the determined polarization state.

2. The method according to claim 1, wherein the pupil of the illumination optical system is divided between the poles of the plurality of poles.

3. The method according to claim 1, wherein the polarization state is represented by at least one of Stokes parameters, a Jones vector, and a degree of polarization.

4. The method according to claim 1, wherein characteristics of a polarization change of the projection optical system, which is represented by at least one of a Mueller matrix and a Jones matrix, is used in the calculation of the imaging performance.

5. The method according to claim 1, wherein the polarization state in a whole of each of the plurality of second partial regions is represented by Jones Vector having same values.

6. An exposure apparatus comprising:

an illumination optical system configured to illuminate an original;

a projection optical system configured to project a pattern of the original; and a control unit configured to adjust the projection optical system based on an aberration of said projection optical system, wherein said control unit executes a process including:

setting an effective light source distribution and a polarization state in a pupil of said illumination optical system, the effective light source distribution including a plurality of poles each having a light intensity higher than a predetermined value, dividing the pupil of the illumination optical system into a plurality of first partial regions in accordance with an arrangement of the plurality of poles in the effective light source distribution, and dividing a pupil of the projection optical system into a plurality of second partial regions respectively corresponding to the plurality of first partial regions of the pupil of the illumination optical system, assuming polarization states for the plurality of second partial regions of the pupil of the projection optical system so that one polarization state that is determined based on a polarization state in the pole of a first partial region of the plurality of first partial regions is assumed for a whole of a corresponding second partial region of the plurality of second partial regions, determining a polarization state of light which emerges from the projection optical system, under a condition in which the plurality of second partial regions have the assumed polarization states, based on characteristics of a polarization change of the projection optical system that represents a relationship between a polarization state of light which enters the projection optical system and light that emerges from the projection optical system, and calculating the aberration of the projection optical system based on the determined polarization state, and adjusting the projection optical system based on the calculated aberration.

7. A non-transitory memory medium storing a computer program for making a computer execute a process for evaluating aberration of a projection optical system for an exposure apparatus which illuminates an original by an illumination optical system and projects a pattern of the original onto a substrate by the projection optical system, the process comprising:

setting an effective light source distribution and a polarization state in a pupil of said illumination optical system, the effective light source distribution including a plurality of poles each having a light intensity higher than a predetermined value;

dividing the pupil of the illumination optical system into a plurality of first partial regions in accordance with an arrangement of the plurality of poles in the effective light source distribution, and dividing a pupil of the projection optical system into a plurality of second partial regions respectively corresponding to the plurality of first partial regions of the pupil of the illumination optical system;

assuming polarization states for the plurality of second partial regions of the pupil of the projection optical system so that one polarization state that is determined based on a polarization state in the pole of a first partial region of the plurality of first partial regions is assumed for a whole of a corresponding second partial region of the plurality of second partial regions; and determining a polarization state of light which emerges from the projection optical system, under a condition in which the plurality of second partial regions have the assumed polarization states, based on characteristics of a polarization change of the projection optical system that represents a relationship between a polarization state of light which enters the projection optical system and light that emerges from the projection optical system, and calculating the aberration of the projection optical system based on the determined polarization state.

* * * * *